United States Patent [19]

Hanson et al.

[11] Patent Number: 5,296,762
[45] Date of Patent: Mar. 22, 1994

[54] BIDIRECTIONAL MICROWAVE AMPLIFIER APPARATUS

[75] Inventors: Larry P. Hanson; Christopher J. Swanke, both of Cedar Rapids, Iowa,

[73] Assignee: Rockwell International Corporation, Seal Beach, Calif.

[21] Appl. No.: 971,426

[22] Filed: Nov. 4, 1992

[51] Int. Cl.$^5$ .................. H03K 3/013; H03B 1/04
[52] U.S. Cl. .................. 307/520; 328/167; 333/101; 333/103; 455/80; 455/84
[58] Field of Search .................. 307/520; 328/167; 333/101, 101, 103, 104; 455/79, 80, 83, 84

[56] References Cited

U.S. PATENT DOCUMENTS

| | | | |
|---|---|---|---|
| 3,550,041 | 12/1970 | Sauter | 307/520 |
| 3,982,212 | 9/1976 | Wallington et al. | 333/104 |
| 4,502,027 | 2/1985 | Ayasli | 333/104 |
| 4,637,073 | 1/1987 | Selin et al. | 455/80 |
| 4,883,984 | 11/1989 | Kess | 333/101 |
| 5,023,935 | 6/1991 | Vancraeynest | 455/80 |
| 5,159,296 | 10/1992 | Nelson | 333/103 |
| 5,193,218 | 3/1993 | Shimo | 455/80 |
| 5,230,090 | 7/1993 | Zametzer et al. | 455/80 |

Primary Examiner—Richard A. Bertsch
Assistant Examiner—David W. Scheuermann
Attorney, Agent, or Firm—Kyle Eppele; M. Lee Murrah; H. Fredrick Hamann

[57] ABSTRACT

A bidirectional amplifier apparatus comprising a plurality of diodes located in a ring structure around an amplifier device to be switched. Each pair of diodes are spaced approximately one quarter wavelength, at the frequency to be passed, in order to maximize isolation across the "off" diode pairs. Use of transmission line devices of approximately one quarter wavelength, at a desired frequency, provide a high impedance at the desired frequency while attenuating higher frequencies where the transmission line devices length approach one half wavelength. The use of the transmission line devices also provide a ground bias for the paired diodes.

11 Claims, 1 Drawing Sheet

BIDIRECTIONAL MICROWAVE AMPLIFIER APPARATUS

This invention was made with Government support under contract number N00019-84-C-0128 awarded by the United States Navy. The Government has certain rights in this invention.

BACKGROUND OF THE INVENTION

This invention relates to the field of amplifiers and more particularly those which are bidirectional or bilinear.

Typical prior art approaches to addressing bidirectional amplifier requirements often comprised the use of two discrete amplifiers each having dedicated circuitry and a switch for controlling signal flow. Depending upon specific manufacturing techniques and components, circuitry tuning and stabilization were compromised or required additional manufacturing time.

Alternate prior art approaches relied upon complex duplicative circuitry controlled, as appropriate, by a transmit/receive switch. The use of such dedicated circuitry dependent upon signal flow increased requirements for space and power, as well as, increased manufacturing costs.

There exists a need for a bidirectional amplifier apparatus comprised of a single amplifier device and using reduced circuitry.

SUMMARY OF THE INVENTION

In accordance with one aspect of the present invention, a bidirectional amplifier apparatus is provided. A plurality of positive-intrinsic-negative (PIN) diodes are located in a ring structure around an amplifier device to be switched. Each pair of diodes are spaced approximately one quarter wavelength, at the frequency to be passed, in order to maximize isolation across the "off" diode pairs. The "off" diode isolation is critical in maintaining circuit stability. A plurality of transmission line devices of one half ($\lambda/2$) wavelength, at the desired frequency band to be attenuated, were used in order to reduce high frequency feed-back. One embodiment of the present invention utilized semi-rigid coaxial stubs as transmission line devices, coupled between a ground and the anode and cathode of a pair of diodes at respective amplifier terminals. The use of the semi-rigid coaxial stubs provide a ground bias for the paired PIN diodes and attenuate frequencies where the stubs approach one-half ($\lambda/2$) wavelength. By selecting stub lengths that produce one half wavelength at various frequencies a low-pass filter is formed and high frequency feed-back is attenuated.

It is an object of the present invention to provide a bidirectional amplifier apparatus having greater stability than prior art bidirectional amplifiers.

It is a feature of the present invention to utilize a single amplifier device.

It is an additional feature of the present invention to utilize common switching circuitry with paired diodes.

It is an advantage of the present invention that a bidirectional amplifier having increased stability and tuning characteristics may be readily produced.

These and other objects, features and advantages are disclosed and claimed in the specification, figures and claims of the present application.

DETAILED DESCRIPTION OF THE FIGURES

Figure 1:
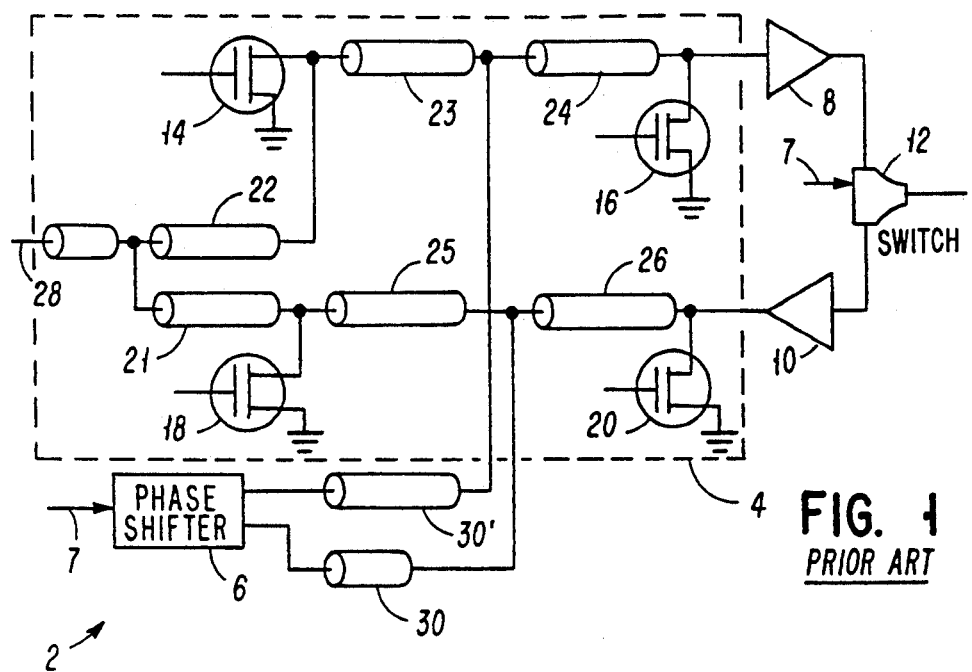
FIG. 1 is a schematic drawing illustrating the circuit configuration of a bidirectional amplifier, as known in the prior art.

Referring now to the Figures where like items are referenced as such throughout, FIG. 1 shows a transceiver element 2 comprised of two amplifiers and a bidirectional switch, as known in the prior art. Transceiver element 2 includes a five port switch 4, an active phase shifter 6, a transmitter amplifier 8, a receiver amplifier 10, and a three port switch 12 as shown. The five port switch 4 may be formed on any common substrate material, such as, semi-insulating gallium arsenide. Formed in active regions of the semi-insulating substrate are four Field Effect Transistors (FETs) 14, 16, 18 and 20. The gate electrode of each transistor is coupled to a first and second control line (not shown). Each transistor is also coupled in a common ground configuration. Switch 4 further includes five transmission lines 21-26, each transmission line having an electrical length, corresponding to one quarter wavelength ($\lambda/4$), where $\lambda$ is the wavelength of the corresponding nominal or operating centerband frequency of the circuit. An input signal 28 is coupled to a first end of transmission lines 21 and 22 respectively. The drain electrode of transistor 18 is coupled to a second end of transmission line 21.

A first end of transmission line 25 is coupled to the second end of transmission line 21 and drain electrode of transistor 18. A second end of transmission line 25 is coupled to the input port of the active phase shifter 40, via transmission line 30 and to a first end of transmission line 26. The second end of transmission line 26 is coupled to the output of the receiver amplifier 10 and to the drain electrode of transistor 20. A second end of transmission line 22 is coupled to a first end of transmission line 23, and the drain electrode of transistor 14. A second end of transmission line 23 is coupled to the output of the active phase shifter 6, via transmission line 30' and to a first end of transmission line 24. A second end of transmission line 24 is coupled to the input of the transmitter amplifier 8 and to the drain electrode of FET 16. Complimentary logic signals are routed via control lines 7 to phase shifter 6 and switch 12 allowing for transceiver 2 to connect the output of amplifier 8 to an antenna means (not shown). Similarly, logic signals control the coupling of a received signal from antenna means through switch 12 and to amplifier 10.

Figure 2:
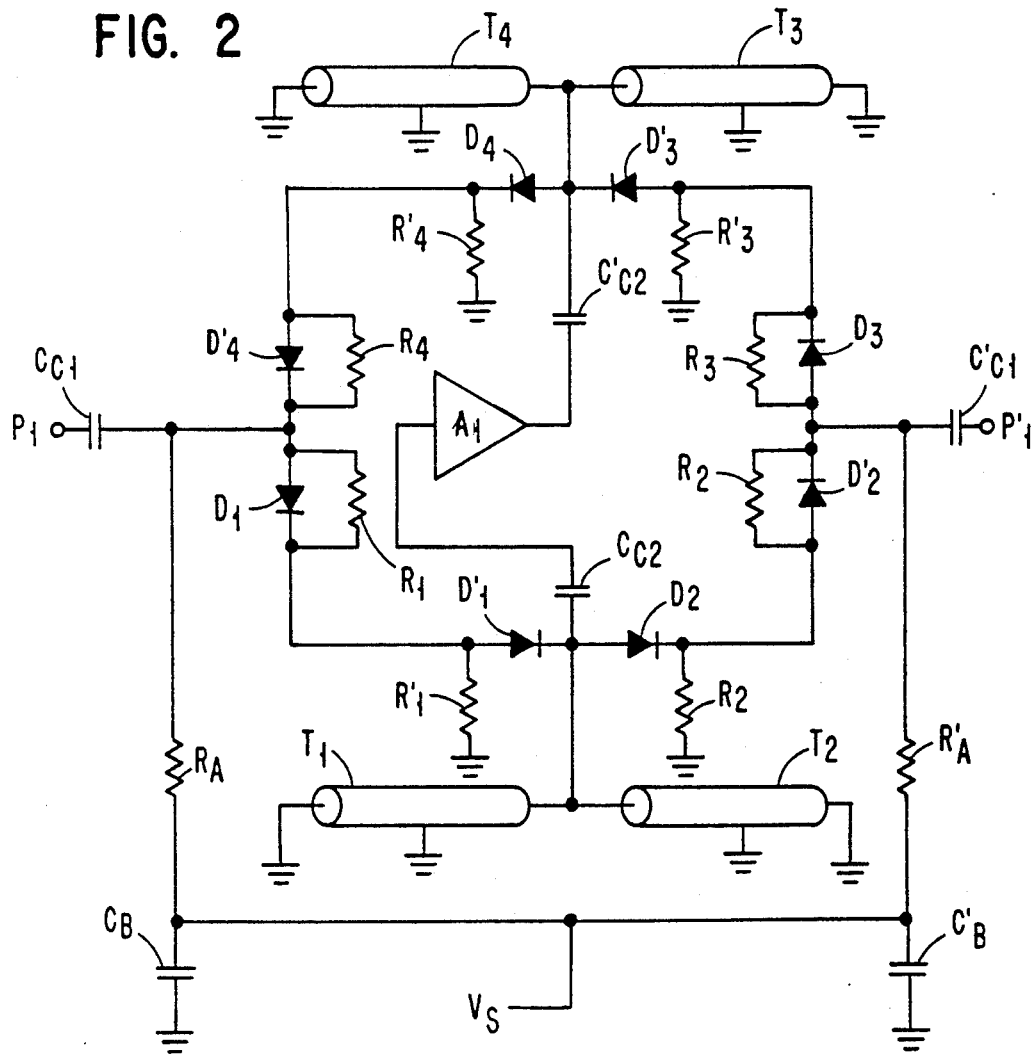
FIG. 2 is a schematic drawing illustrating the circuit configuration of the present invention.

FIG. 2 illustrates one embodiment of the present invention. Amplifier $A_1$ is made bidirectional by the switching circuitry, herein described. A voltage control signal $V_S$ is coupled through resistors $R_4$ and $R'_4$ and then on to a ring structure of paired diodes for enabling an RF signal path to flow through amplifier $A_1$. The diodes are arranged in pairs, $D_1$ and $D'_1$; $D_2$ and $D'_2$; $D_3$ and $D'_3$; and $D_4$ and $D'_4$, each coupled in serial fashion, anode to cathode of the adjacent diodes and controlled by signal $V_S$. Resistor $R_1$ is coupled in parallel fashion with diode $D_1$. Resistor $R'_1$ has a first terminal coupled between the cathode of diode $D_1$ and the anode of diode $D'_1$ and has its other terminal coupled to a ground. Resistors $R_2$, $R'_2$, $R_3$, $R'_3$, $R_4$, and $R'_4$ are similarly coupled to diodes $D'_2$, $D_2$, $D_3$, $D'_3$, $D'_4$, and $D_4$, respectively.

Transmission line devices $T_1$ and $T_2$ each have a first end coupled between $D'_1$, $D_2$ and $C_{C2}$, while their second terminal is coupled to a ground source. Transmission lines $T_3$ and $T_4$ are similarly configured between $C'_{C2}$, $D'_3$ and $D_4$. Grounded capacitors $C_B$ and $C'_B$ are serially coupled to resistors $R_A$ and $R'_A$ on the $V_S$ input side of each resistor, respectively.

Port $P_1$ and $P'_1$ provide input/output ports for an RF signal passing through amplifier $A_1$. Capacitor $C_{C1}$ has a first terminal coupled to port $P_1$ and a second terminal coupled to the second terminal of resistor $R_A$, $D'_4$, $R_4$, $D_1$, and $R_1$. Capacitor $C'_{C1}$ is similarly configured between port $P'_1$ and resistor $R'_A$, $R_2$, $R_3$, $D_3$, and $D'_2$. Finally, capacitor $C_{C2}$ has a first terminal coupled to an input terminal of amplifier $A_1$ and a second terminal coupled between diodes $D'_1$, $D_2$, $T_1$ and $T_2$. Capacitor $C'_{C2}$ is similarly configured between an output terminal of amplifier $A_1$, $D'_3$, $D_4$, $T_3$ and $T_4$.

During normal operations, signal $V_S$ controls the biasing and reverse biasing of each of the above described diodes, thereby providing an "on" path for an RF signal to pass through amplifier $A_1$. Capacitors $C_B$ and $C'_B$ serve to eliminate or minimize any unwanted signal from ports $P_1$ or $P'_1$ to signal $V_S$ or vice versa. Capacitors $C_{C1}$, $C'_{C1}$, $C_{C2}$ and $C'_{C2}$ serve to couple the desired signal and block the DC control voltage, of signal $V_S$, from any sensitive RF signal path.

Assuming an incoming RF signal from port $P_1$, voltage control signal circuitry (not shown) sends an enabling signal $V_{S1}$ to diodes $D_1$ and $D'_1$, $D'_3$ and $D_3$, while simultaneously providing a reverse biasing signal to diodes $D'_2$ and $D_2$, $D'_4$ and $D_4$. Resistors $R_2$, $R'_2$ provide a path of travel for reverse biasing signal $V_{S1}$ to bypass $D'_2$ and on to diode $D_2$. The values of $R_2$ and $R'_2$ are selected to be high in relation to the characteristic impedance of the RF signal path. Resistors $R_4$ and $R'_4$ serve simliar reverse biasing roles for diodes $D'_4$ and $D_4$, respectively, in response to signal $V_{S1}$ and are also chosen to be of high resistance value in relation to the characteristic impedance of the RF signal path. Diode pairs $D_2$, $D'_2$ and $D_4$, $D'_4$ are spaced approximately one quarter wavelength ($\lambda/4$), at the desired frequency, in order to maximize isolation across the "off" diodes, thereby providing decreased positive feedback about the amplifier circuit.

Transmission line devices $T_1$, $T_2$, $T_3$ and $T_4$ serve to reduce high frequency feed-back about amplifier $A_1$. As shown the transmission line devices are coaxial stubs but it is understood that other transmission line devices would also work with the teachings of the present invention. A plurality of semi-rigid coaxial stubs of approximately one quarter ($\lambda/4$) wavelength (high impedance), at the desired frequency bands, were used in order to reduce high frequency feed-back at approximately two times the desired frequency where the coaxial stubs are one half ($\lambda/2$) wavelength or low impedance. At least one transmission line device must be included on the input and the output side of the amplifier in each RF signal path to provide a DC ground for the diode pairs. As the RF frequency is increased, the isolation provided by "off" diodes decreases providing feedback about amplifier $A_1$ that if left unchecked would result in the amplifier becoming unstable or oscillating. Accordingly, Transmission lines $T_1$ through $T_4$ are selected to provide high impedance at frequencies desired to be passed and low impedance for frequency at which the "off" diodes impedance drops.

In those instances in which it is desired to have an RF signal enter from port $P'_1$ a second voltage signal $V_{S2}$ serves to enable diodes $D'_2$, $D_2$, $D_4$ and $D'_4$. As in the description provided for the case of $V_{S1}$, the diodes that are not enabled ($D_1$, $D'_1$, $D_3$, $D'_3$) are considered "off" and in conjunction with transmission line devices $T_1$ through $T_4$ serve as a low pass filter thereby preventing the high frequency signals from being fed back around amplifier $A_1$, effectively reducing the high frequency gain of the circuit and thereby preventing the amplifier from oscillating. Resistors $R_1$, $R'_1$, $R_3$, $R'_3$ are responsive to signal $V_{S2}$, serving as current paths for reverse biasing diodes $D_1$, $D'_1$, $D_3$ and $D'_3$, respectively, in the same manner and have resistance values similar to the above described resistors in response to signal $V_{S1}$. Accordingly, shunting the RF to ground through transmission lines $T_1$ through $T_4$ at frequencies where the transmission line length approaches $\lambda/2$ and at the same time presenting a high impedance at desired frequency ($\lambda/4$). An RF signal from port $P'_1$ may thus be routed through amplifier $A_1$ and on to port $P_1$ in a similar fashion as an RF signal input from $P_1$ with diodes that were "on" when $V_{S1}$ was received being turned "off" by $V_{S2}$, and those diodes that were "off" via $V_{S1}$ now being "on".

It is thought that the methods of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

We claim,

1. A bidirectional microwave frequency amplifier apparatus comprising:
   an amplifier device;
   a plurality of paired diodes symmetrically coupled to the amplifier device; and
   a plurality of transmission line devices coupled to either end of the amplifier device;
   wherein the paired diodes are strategically placed in relation to each other in order to provide circuit isolation to "off" diodes and the transmission line devices reduce high frequency feedback.

2. The apparatus of claim 1 wherein the paired diodes are spaced one quarter wavelength apart, at the desired frequency to be passed.

3. The apparatus of claim 1 wherein the paired diodes are comprised of four pairs of diode devices.

4. The apparatus of claim 1 wherein the transmission line devices are semi-rigid coaxial stubs of approximately one quarter wavelength, at a desired frequency and thereby providing a high impedance at the desired frequency while attenuating higher frequencies where the stub length approaches one half wavelength.

5. The apparatus of claim 1 wherein the transmission line devices provide a DC ground for diode bias while simultaneously presenting high impedance at the desired frequency.

6. A bidirectional microwave frequency amplifier apparatus having a voltage control signal for diode biasing and an RF signal input and output port, comprising:
   an amplifier device;

a plurality of paired diodes coupled anode to cathode to each other, forming a ring structure coupled to the amplifier device; and, a plurality of transmission line devices coupled in a symmetrical pattern to either end of the amplifier device;

wherein the paired diodes are strategically placed in relation to each other in order to provide circuit isolation to "off" diodes and the plurality of transmission line devices reduce high frequency feedback.

7. The apparatus of claim 6 wherein the paired diodes are spaced one quarter wavelength apart, at the desired frequency to be passed.

8. The apparatus of claim 6 wherein the paired diodes are comprised of four pairs of diode devices.

9. The apparatus of claim 6 wherein the transmission line devices are semi-rigid coaxial stubs located at either end of the amplifier device and are of one-half wavelength, at the frequency to be attenuated.

10. The apparatus of claim 6 further comprising a plurality of resistors coupled in parallel fashion to certain of the paired diodes providing a path for reverse biasing subsequent "off" diode.

11. The apparatus of claim 6 further comprising a pair of capacitor devices, one each coupled in serial fashion to the paired diodes ring structure providing blocking of unwanted signals on the RF signal path.

* * * * *